United States Patent [19]
Lowe

[11] Patent Number: 5,414,745
[45] Date of Patent: May 9, 1995

[54] SYNCHRONIZED CLOCKING DISABLE AND ENABLE CIRCUIT

[75] Inventor: William M. Lowe, Austin, Tex.

[73] Assignee: Advanced Micro Devices, Inc., Sunnyvale, Calif.

[21] Appl. No.: 69,521

[22] Filed: Jun. 1, 1993

[51] Int. Cl.$^6$ .............................. G11C 19/28
[52] U.S. Cl. .................... 377/114; 377/81; 377/79; 327/142; 327/292
[58] Field of Search ............ 307/279, 262, 603, 291, 307/516, 272.1, 272.2, 272.3; 328/55, 206, 155; 377/114, 79, 81; 315/302

[56] References Cited

U.S. PATENT DOCUMENTS

| | | | |
|---|---|---|---|
| 2,519,184 | 8/1950 | Grosdoff | 377/107 |
| 3,885,234 | 5/1975 | Klein et al. | 343/7 |
| 4,374,331 | 2/1983 | Yamamoto et al. | 307/291 |
| 4,627,085 | 12/1985 | Yuen | 372/81 |
| 4,937,504 | 6/1990 | Black, Jr. et al. | 315/307 |
| 4,974,241 | 11/1990 | McClure et al. | 307/279 |
| 5,105,108 | 4/1992 | Ngo | 307/262 |
| 5,124,597 | 6/1992 | Stuebing et al. | 307/603 |
| 5,157,277 | 10/1992 | Tran et al. | 307/262 |
| 5,208,546 | 5/1993 | Nagaraj et al. | 307/262 |
| 5,239,206 | 8/1993 | Yanai | 307/603 |

Primary Examiner—Timothy P. Callahan
Assistant Examiner—Dinh Le
Attorney, Agent, or Firm—Conley, Rose & Tayon

[57] ABSTRACT

A clocking disable and enable circuit is provided having an input for receiving a clocking signal and another input for receiving a disable/enable signal. The disable and enable circuit provides a clocking disable/enable output from the circuit which is synchronized with the clocking signal during times in which the disable/enable signal is not activated. At times during which the disable/enable signal is activated, the clocking disable-/enable signal transitions after at least a one half clocking period to a steady state value (either high or low voltage level). After the disable/enable signal becomes inactive again, clocking disable/enable signal automatically resynchronizes to the clocking signal. The clocking disable and enable circuit herein is well suited for providing glitch-free transition between a clocking state and a steady state to a synchronized digital or analog circuit which depends upon clocking synchronization for its operation. The clocking disable and enable circuit herein is also well suited for providing temporary halt to the connected digital or analog circuit as well as providing periods of selective demodulation associated with frequency tracking communication systems.

11 Claims, 2 Drawing Sheets

SYNCHRONIZED CLOCKING DISABLE AND ENABLE CIRCUIT

BACKGROUND OF THE INVENTION

1. Field of the Invention

This invention relates to an electronic circuit and more particularly to a synchronized clocking disable and enable circuit.

2. Background of the Relevant Art

A clocking circuit used for generating a plurality of pulses is well known. The pulses are preferably produced with extreme regularity and are often synchronized with the operation of digital circuits attached to the output of the clocking circuit. The clocking pulses are thereby used to control the speed of operation of the digital circuits which may be contained on the same monolithic circuit as that of the clocking circuit.

In order to ensure optimal performance of the digital circuit receiving the pulses, each pulse must have a set duration and the duration must not substantially vary. For example, a high level voltage pulse must remain high for a minimum duration but not to exceed that of a maximum duration. Likewise, a low level voltage pulse must also remain low more than and less than a minimum and maximum duration, respectively. If a high or low pulse is less than an acceptable time duration, then a "glitch" may occur causing possible failure of the connected digital circuits.

It is oftentimes desirable to temporarily disable the stream of clocking pulses produced from the clocking circuit. By disabling the clocking pulses, certain attached digital circuits can be temporarily placed in a halt condition. For example, microprocessor or microcontroller operations can generally be halted in such a manner. To perform a temporary disable of the clocking pulses, a clocking disable and enable circuit is generally placed between the clocking circuit and the corresponding digital circuits. The clocking disable and enable circuit receives free-running, continuous periods of clocking pulses, and also receives a disable signal which can exceed several clocking periods. When the disable signal is activated, the clocking disable and enable circuit sends to the digital circuits a steady state output indicating a momentary halt of clocking pulses. During the time in which the clocking disable and enable circuit receives the disable signal, a transitional glitch often occurs in the output of conventional disable and enable circuits causing the connected digital circuits to malfunction. The glitch, defined herein as a clocking pulse having a duration less than the target pulse duration, may cause the attached digital circuits to lose or misplace operational status or data (stored or modulated data). Accordingly, many conventional disable and enable circuits generally provide one or more glitches each time the output transitions from the clocking state to the disable or steady state. Likewise, when the disable and enable circuit re-enables clock pulses, one or more glitches may also appear at the output during transitions from the steady state to the clocking state.

SUMMARY OF THE INVENTION

The problems outlined above are in large part solved by the synchronized clocking disable and enable circuit of the present invention. That is, the disable and enable circuit hereof ensures that no glitches occur during the output transition between a free-running clocking state and a steady state. Steady state output does not occur until after an entire high or low pulse duration of the clocking pulses has occurred but before the next pulse. Likewise, when the disable signal ceases, the disable and enable circuit output transitions after an entire high or low pulse duration of the clocking pulses has occurred but before the next pulse. After disable has ended, the disable and enable circuit output transitions back to a clocking state, wherein the clocking state is substantially equal to and in sync with the clocking pulses produced from the clocking circuit.

By assuring a glitch-free transition, the present invention is suited for applications requiring a disable and enable circuit output synchronized with the clocking pulses output from the clocking circuit. Such applications include, but are not limited to, demodulators and microprocessor-based timing circuitry. Microprocessors which are designed for static operation (i.e., those which are capable of retaining their state when the internal clock is held in a constant state) can easily incorporate the present invention in order to smoothly transition from dynamic to static operation and vice versa. Furthermore, microprocessors which require a phase locked loop (PLL) clocking configuration and output find it necessary to provide a smooth dynamic to static, or static to dynamic transition. Yet a PLL cannot provide such a transition when it is stopped and restarted on the fly. PLLs generally require a long startup period in order to synchronize or lock onto a clocking output. Thus, it is desirable to allow the PLL to run freely, and to place a synchronizing disable/enable circuit of the present invention between the PLL and the internal clock drivers of the microprocessor (or digital circuitry). The PLL can continue running while the disable/enable circuit disables or enables the internal drivers in sync with the PLL clocking pulses. A substantial amount of power is consumed when a microprocessor's internal clock runs. Disabling the internal clock at synchronized moments and placing the processor into a static state is a very desirable feature of the present invention. Momentary disable of the processor will control the power consumption, resulting in cooler operating temperatures and, in a battery operated environment, providing longer battery life between charges.

Broadly speaking, the present invention contemplates a clocking disable and enable circuit comprising a multiple stage latching circuit having an input and an output. The latching circuit is capable of receiving a disable signal at the input and delaying the disable signal at the output until the latching circuit receives specific sequential clocking pulses from a clocking signal. The clocking disable and enable circuit further comprises a logic gate coupled to the output of the latching circuit. The logic gate is capable of producing a steady state output signal during a transition of the clocking signal and upon receiving the delayed disable signal.

The steady state output signal can be either a logic level high or a logic level low depending upon the configuration of the clocking disable circuit. The clocking disable and enable circuit can be configured to receive opposite polarities of the clocking signals and, depending upon the polarity configuration chosen, the clocking disable and enable circuit can produce either a relatively high steady state voltage or a relatively low steady state voltage at its output. If, for example, the steady state output from the clocking disable and enable circuit is at a relatively low voltage level, then the logic gate is preferably configured as a nand gate and the low steady state output is produced at the transition of the clocking signal from a relatively high voltage level to a relatively low voltage level during times in which the nand gate receives the delayed disable signal. Conversely, and as a further example, if steady state output is at a relatively high voltage level, then the logic gate is preferably configured as a nor gate and the high steady state output is produced at the transition of the clocking signal from a relatively low voltage level to a relatively high voltage level during times in which the nor gate receives the delayed disable signal. In the former example, the steady state output signal is of opposite polarity to and begins immediately after the high voltage pulse duration of one cycle of the clocking signal has occurred and continues until immediately after another high voltage pulse duration of a subsequent cycle of the clocking signal-has occurred. Conversely, in the latter example, the steady state output signal is of opposite polarity to and begins immediately after the low voltage pulse duration of one cycle of the clocking signal has occurred and continues until immediately after another low voltage pulse duration of a subsequent cycle of the clocking signal has occurred.

The present invention further contemplates a carrier signal frequency tracking system with synchronized clocking disable and enable. The tracking system includes an oscillator and a clocking disable and enable circuit. The clocking disable and enable circuit has one input coupled to receive a clocking signal from the oscillator and another input coupled to receive a disable/enable signal. The clocking disable and enable circuit further includes a multiple stage latching circuit having a latching input and a latching output. The latching circuit is capable of receiving the disable/enable signal at the latching input and delaying the disable/enable signal at the latching output until the latching circuit receives the clocking signal. A logic gate is included with the clocking disable and enable circuit having two logic inputs and a single logic output. One logic input is coupled to receive the delayed disable/enable signal and the other logic input is coupled to receive the clocking signal. The logic output produces a logic output signal synchronized with and substantially equal to the clocking signal. Logic output signal transitions from a clocking state (synchronized with the input clocking signal) to a high or low steady state voltage at a time in which one input receives a transition of the clocking signal coincident with a time during which the other input receives the delayed disable/enable signal. The logic output signal further transitions from the steady state to a clocking state, again becoming synchronized with and substantially equal to the clocking signal, at a time in which one input receives a transition of the clocking signal coincident with a time during which the other input ceases receiving the delayed disable/enable signal.

A frequency shift detector circuit is further included having two detector inputs and a detector output. The detector output varies in voltage magnitude depending upon the frequency difference between a carrier signal placed on one detector input and the logic output signal placed on the other detector input. Accordingly, the oscillator can be voltage controlled and the frequency shift detector can be placed within the feed-back loop of the voltage controlled oscillator to form a demodulator or phase-locked loop.

BRIEF DESCRIPTION OF THE DRAWINGS

Other objects and advantage of the invention will become apparent upon reading the following detailed description and upon reference to the accompanying drawings in which.

Figure 1:
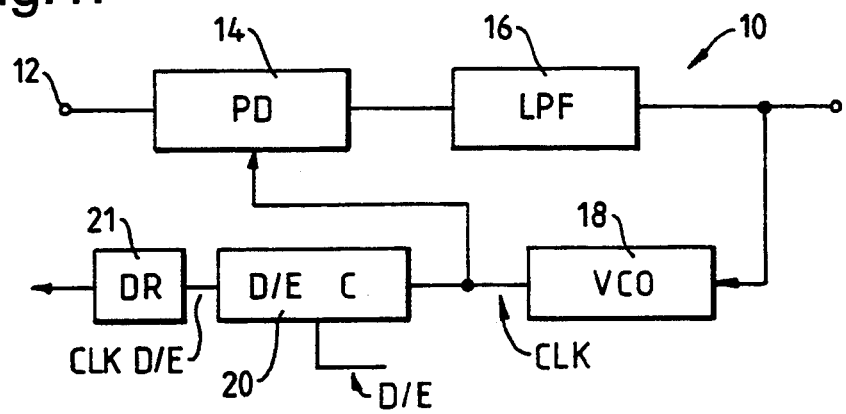
FIG. 1 is a block diagram of an exemplary carrier signal frequency tracking system according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is cover all modifications, equivalents and alternatives falling within the spirit and scope of the present invention as defined by the appended claims.

DETAILED DESCRIPTION OF THE INVENTION

Turning now to the drawings, FIG. 1 illustrates a block diagram of an exemplary carrier signal frequency tracking system 10 of the present invention. Tracking system 10 includes terminal 12 capable of receiving an input signal. The input signal can be sent or modulated on a carrier signal, wherein the carrier signal is fixed at a carrier frequency. In order to demodulate the input signal from the carrier signal, it is important that system 10 be synchronized to track the carrier frequency.

Tracking techniques often utilize a phase-locked loop (PLL) common in the art. The phase-locking occurs by using a phase detector 14 for receiving the modulated input signal. Feedback information from the phase-locked loop arise at phase detector 14 such that phase detector 14 acts as a mixer. A low pass filter 16 transmits substantially DC voltage at its output. Depending upon the difference between the carrier signal frequency and the output of oscillator 18, varying DC offset voltage occurs at the output of low pass filter 16. Oscillator 18 is a voltage controlled oscillator which produces a PLL output clocking signal (CLK signal) of varying frequencies depending upon the change in DC offset voltage output from filter 16. Accordingly, oscillator 18 transmits CLK signal to phase detector 14. If the frequency of the clocking signal matches the carrier frequency at terminal 12, then phase detector 14 produces little or no DC offset. Minimum amounts of offset will not cause oscillator 18 to change frequency output. Oscillator 18 output, or clocking signal, is therefore said to be "locked" in frequency and in phase with the carrier frequency. If any change occurs in the carrier frequency, then offset will exist causing a corresponding change in the clocking signal (or CLK signal).

In many instances it is necessary that clocking signals be disabled momentarily or that tracking system 10 be temporarily halted. If such is the case, a disable and enable circuit 20 may be incorporated between oscillator 18 and internal clock drivers 21. Clock drivers 21 provide necessary output levels for driving an attached digital circuit or processor (not shown). Upon receiving a disable/enable signal (D/E signal), circuit 20 will force clocking signal to become disabled in either a steady state high or low voltage depending upon the configuration of circuit 20. A particular advantage of circuit 20 as described hereinbelow is the ability to disable the clocking signal at a clocking signal transition and then subsequently re-enable the clocking signal at a clocking signal transition. Disable and enable occur without any glitches being produced at the clocking disable/enable signal (CLK D/E signal). The clocking disable/enable signal sent from circuit 20 to internal clock drivers 21 is therefore in sync with the input clocking signal. Transfers between a clocking state and a steady state occur in sync with the input clocking signal such that system 10 remains in clocking signal sync even after momentary halting operation. Continued synchronization is necessary to achieve optimal performance of system 10. The PLL can run freely even though disable/enable circuit 20 output is halted. It is important to note, however, that a PLL need not always be used in conjunction with disable/enable circuit 20. Circuit 20 can in such instances be used to allow an asynchronous clock disable and enable output.

Figure 2:
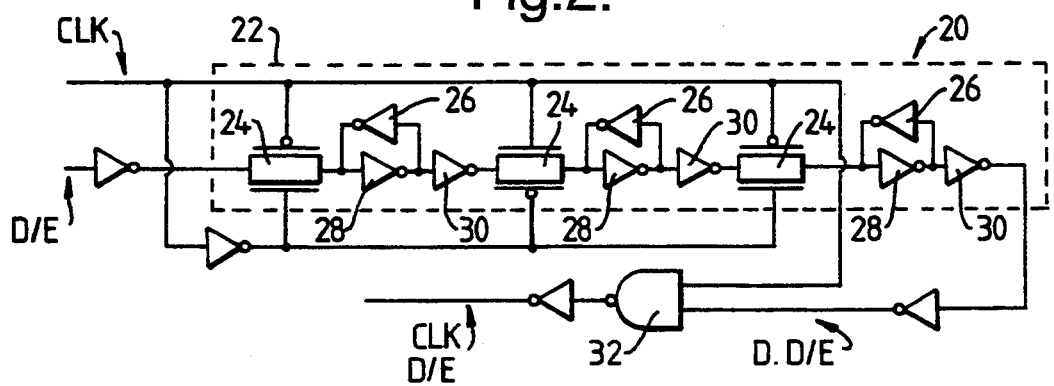
FIG. 2 is a circuit diagram of one embodiment of the clocking disable and enable circuit according to the present invention.

Referring to FIG. 2, a circuit diagram of one embodiment of clocking disable and enable circuit 20 is shown. Circuit 20 includes a multiple stage latching circuit 22. Each stage of latching circuit 22 comprises a transmission gate or pass gate 24, reverse-coupled inverters 26 and 28 (shown in a latching configuration), and another inverter/buffer 30. There are three latching stages shown in latching circuit 22 of FIG. 2. In order for the output of circuit 22 to transition without glitches, at least three stages are needed to provide the necessary delaying of the disable/enable signal. By using three stages, the delay disable/enable signal (D. D/E signal) is ensured of toggling at least one half a clocking signal cycle after the time in which the disable/enable signal (D/E signal) is transitioned. By delaying the disable/enable signal at least one half a clocking cycle, the delayed disable/enable signal does not toggle until all transients of the disable/enable signal are resolved. The delayed disable/enable signal also synchronizes with a falling edge of the input CLK (shown in the embodiment of FIG. 2) or synchronizes with the rising edge of input CLK (shown in the embodiment of FIG. 3).

Clocking signal (CLK signal) activates the first and third stages of circuit 22 during the relatively low clocking cycles/pulses. Likewise, clocking signal activates the second stage of circuit 22 during high clocking cycles/pulses. The selectively conductive paths formed by modulated transmission gates 24 allow disable/enable signal to be transmitted via the clocking signal to an output of circuit 22. The transmitted disable/enable signal is delayed at least one half a clocking cycle, and is presented as delayed disable/enable signal (D. D/E signal).

A logic gate 32 receives the delayed disable/enable signal and combines that signal with the clocking signal. In the embodiment shown in FIG. 2, the disable/enable signal and clocking signal are nanded together and, after inversion, form a clocking disable/enable signal (CLK D/E signal) as shown. Clocking disable/enable signal is in a clocking state and synchronized with the clocking signal during times in which the delayed disable/enable signal is not active. During times in which delayed disable/enable signal is active, clocking disable/enable signal assumes a steady state value.

An important advantage of the present invention is not only the ability to synchronize the clocking disable/enable signal with the clocking signal, but also to delay the disable/enable signal until after all transients associated with the signal have passed. Still further, changes in state of the clocking disable/enable signal between a steady state and a synchronized clocking occur without any glitches, and the resulting clocking state always remains of the same polarity and synchronized with the clocking signal when the delayed disable/enable is not active.

The embodiment shown in FIG. 2 illustrates one example of circuit 20 connected such that the delayed disable/enable signal transitions coincident with the clocking signal from a high to low state, and the resulting clocking disable/enable signal will then disable to a low voltage state. Conversely, during times in which the delayed disable/enable signal transitions from a low to a high state, clocking disable/enable signal will follow the clocking signal. The following table I illustrates the operation of circuit 20 shown in FIG. 2, wherein the delayed disable/enable signal represents a similar but delayed polarity signal of the disable/enable signal:

TABLE I

| D. D/E Signal | CLK Signal | CLK D/E Signal |
|---|---|---|
| 1 | 1 | 1 |
| 1 | 0 | 0 |
| 0 | 1 | 0 |
| 0 | 0 | 0 |

Figure 3:
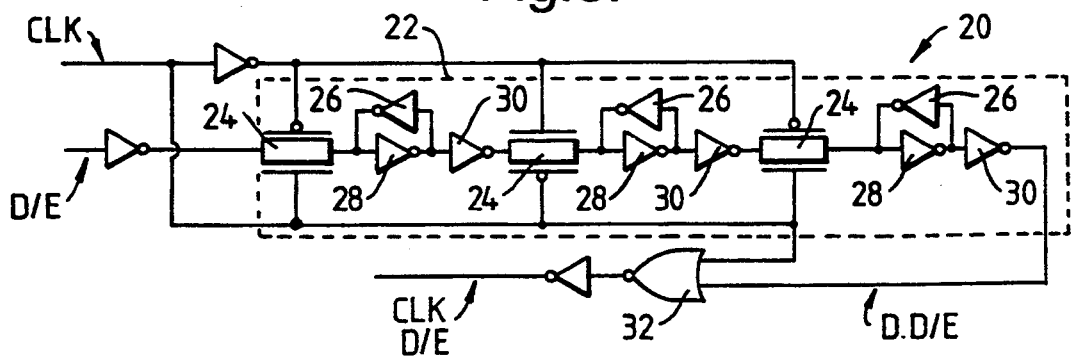
FIG. 3 is a circuit diagram of another embodiment of the clocking disable and enable circuit according to the present invention.

Referring to FIG. 3, an alternative embodiment of disable and enable circuit 20 is shown. In particular, circuit 20 can be configured having a multiple stage latching circuit similar to that shown in FIG. 2. However, instead of logic gate 32 being a nand gate, as shown in FIG. 2, logic gate 32 can be a nor gate, as shown in FIG. 3. The delayed disable/enable signal can be nored with the clocking signal to produce, after inversion, clocking disable/enable signal as shown. Using a nor gate instead of a nand gate is preferred if it is desirable that clocking disable/enable signal be disabled in a steady state high voltage level. Thus, either embodiment shown in FIGS. 2 and 3 can be used depending upon the design requirements of the steady state output of clocking disable/enable signal. The embodiment of FIG. 2 produces a low voltage steady state disabled output, while the embodiment of FIG. 3 produces a high voltage steady state disabled output. Depending upon the value of disable/enable signal desired, one of the two alternative embodiments may be chosen. If a clock disable is desired in a low transition state, then the embodiment shown in FIG. 2 is preferred. Conversely, if a clock disable is desired in a high state, then the embodiment shown in FIG. 3 is preferred. The following table II illustrates the operation of circuit 20 shown in FIG. 3, wherein the delayed disable/enable signal represents a similar but delayed polarity signal of the disable/enable signal:

TABLE II

| D. D/E Signal | CLK Signal | CLK D/E Signal |
| --- | --- | --- |
| 1 | 1 | 1 |
| 1 | 0 | 1 |
| 0 | 1 | 1 |
| 0 | 0 | 0 |

Figure 4:
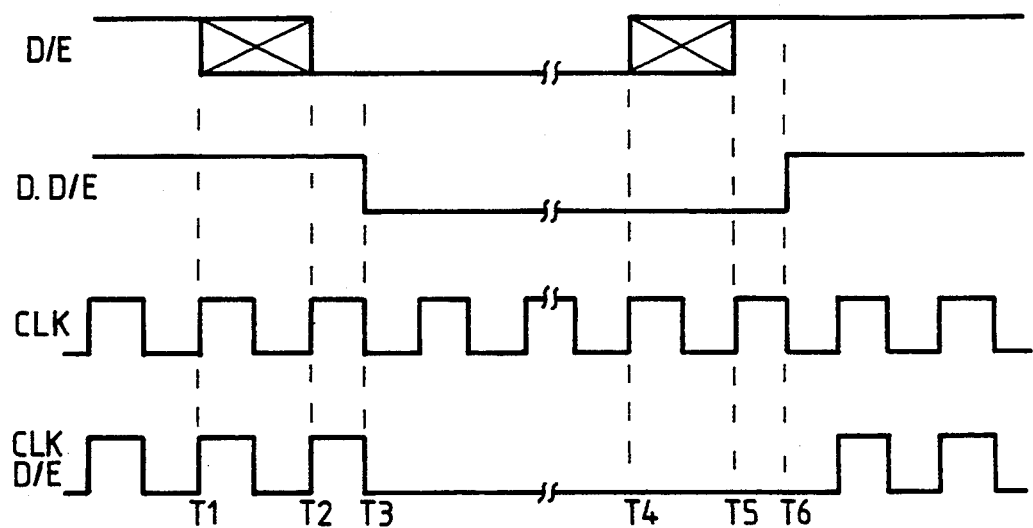
FIG. 4 are timing diagrams of various signals received and produced by the clocking disable and enable circuit shown in Fig. 2.
Figure 5:
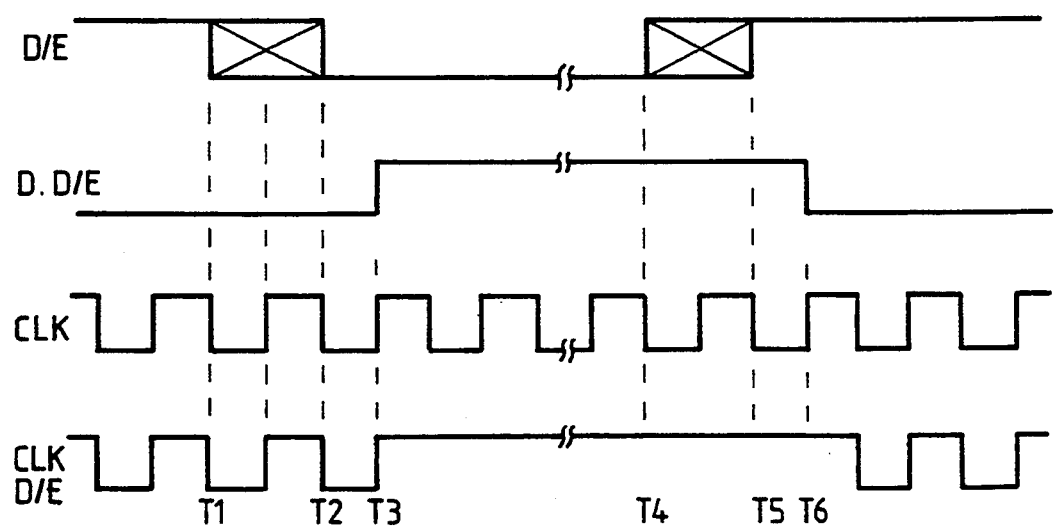
FIG. 5 are timing diagrams of various signals received and produced by the clocking disable and enable circuit shown in Fig.

Further details regarding the operation of disable and enable circuit 20 for either embodiment is illustrated in FIGS. 4 and 5. Specifically, FIG. 4 shows a timing diagram for various signals produced according to the embodiment of FIG. 2. FIG. 5 shows a timing diagram for various signals produced according to the embodiment of FIG. 3.

Referring to FIG. 4, disable/enable signal can toggle from a high voltage state to a low voltage state at any time within a clocking signal period (i.e., between time T1 and T2). The delayed disable/enable signal will always be delayed at least one half clocking cycle from the disable/enable signal transition (i.e., delayed to time T3). Regardless of whether disable/enable signal transitions early at T1, late at T2, or any time therebetween, delayed disable/enable signal will always transition at least one half a clocking cycle and at most one and one half clocking cycle thereafter. By delaying the disable/enable signal by at least one half the clocking cycle, clocking disable/enable signal will transition to its steady state or disabled value in sync with the clocking signal. Specifically, clocking disable/enable signal will transition at time T3 from a high voltage state to a low voltage state corresponding with the high-to-low transition of the clocking signal and coincident delayed disable/enable signal high-to-low transition. The circuit operation of FIG. 2, shown in FIG. 4, also provides synchronous enable. At any time T4 through T5, disable/enable signal can transition back to a high state causing the delayed disable/enable signal to transition at least one half a clocking cycle thereafter. When delayed disable/enable signal transitions, coincident with clocking signal transition (i.e., during time T6), the clocking disable/enable signal will resume clocking state at a low pulse level, synchronized with the clocking signal. Thus, beginning at time T6, clocking disable/enable signal is substantially equal to the clocking Signal.

Referring to FIG. 5, operational conditions of various signals within the embodiment of FIG. 3 is shown. Specifically, disable/enable signal can toggle low at a time between T1 and T2, and thereafter toggle high at a time between T4 and T5. Delayed disable/enable signal is activated at time T3, at least one half a clocking cycle and at most one and one half clocking cycle after the disable/enable signal is activated. Once activated, delayed disable/enable signal transitions coincident with the clocking transition causing clocking disable/enable signal to transition to a steady state high value at time T3. After the delayed disable/enable signal is no longer activated at time T6, the clocking disable/enable signal transitions back to a clocking state, initially high.

It will be appreciated to those skilled in the art having the benefit of this disclosure that this invention is believed to be capable of applications with numerous types of synchronized digital and analog circuits. The disable and enable circuit hereof provides and maintains clocking synchronization to the connected digital and/or analog circuits throughout the disable and re-enable periods. It is also to be understood that the form of the invention shown and described is to be taken as presently preferred embodiments. Various modifications and changes may be made without departing from the spirit and scope of the invention as set forth in the claims. An exemplary modification might be one which uses more than three latching stages. Moreover, logic gate 32 can include other types of logic functions beyond a nand gate, nor gate or combinations thereof. Provided the clocking disable/enable signal is synchronized with the clocking circuit during non-disable periods and transitions to a steady state in sync with clocking signal transitions during disable periods, any modifications to the multiple latching stages or logic gate can be performed and still remain within the spirit and scope of the present invention. It is intended that the following claims be interpreted to embrace all such modifications and changes.

What is claimed is:

1. A clocking disable and enable circuit comprising:
   a multiple stage latching circuit having a latching input and a latching output, said latching circuit is capable of receiving a disable signal at said input and is also capable of delaying said disable signal at said output until said latching circuit receives a clocking signal; and
   a logic gate having two logic inputs and a single logic output, wherein one logic input is coupled to receive the delayed said disable signal and the other logic input is coupled to receive said clocking signal, said logic output produces a logic output signal synchronized with said clocking signal, and said logic output signal transitions to a steady state voltage at a time in which one input receives a transition of said clocking signal and coincident with a time during which said other input receives the delayed said disable signal, said logic output signal further transitions from said steady state voltage to become synchronized with and equal to said clocking signal at a time in which one input receives a transition of said clocking signal coincident with a time during which said other input ceases receiving the delayed said disable signal.

2. The clocking circuit as recited in claim 1, wherein said latching circuit comprises at least three latching stages connected in series, wherein each latching stage includes a selectively conductive path connected in series with a latch.

3. The clocking circuit as recited in claim 2, wherein said selectively conductive path is regulated upon receiving said clocking signal.

4. The clocking circuit as recited in claim 1, wherein said logic gate comprises a nand gate and the transition of said clocking signal is from a high voltage level to a low voltage level, wherein said high voltage level is greater than said low voltage level.

5. The clocking circuit as recited in claim 1, wherein said logic gate comprises a nor gate and the transition of said clocking signal is from a low voltage level to a high voltage level, wherein said high voltage level is greater than said low voltage level.

6. The clocking circuit as recited in claim 1, wherein said steady state output signal continues for a duration equal to a set period of multiple half cycles of said clocking signal.

7. The clocking circuit as recited in claim 1, wherein said steady state output signal occurs completely after a low-to-high voltage transition of one cycle of said clocking signal has occurred.

8. The clocking circuit as recited in claim 1, wherein said steady state output signal begins completely after a high-to-low voltage transition of one cycle of said clocking signal has occurred.

9. A carrier signal frequency tracking system with synchronized clocking disable and enable, comprising:
   an oscillator;
   a clocking disable and enable circuit having two inputs and an output, wherein one input is coupled to receive a clocking signal from said oscillator and the other input is coupled to receive a disable/enable signal, said clocking disable and enable circuit further includes:
      a multiple stage latching circuit having a latching input and a latching output, said latching circuit is capable of receiving said disable/enable signal at said input and delaying said disable/enable signal at said output until said latching circuit receives said clocking signal;
      a logic gate having two logic inputs and a single logic output, wherein one logic input is coupled to receive the delayed said disable/enable signal and the other logic input is coupled to receive said clocking signal, said logic output produces a logic output signal synchronized with said clocking signal and said logic output signal transitions to a steady state voltage at a time in which one input receives a state of said clocking signal which is equivalent to a desired state of the steady state voltage of said logic output signal, and said logic output signal transitions to a steady state voltage coincident with a time during which said other input receives the delayed said disable/enable signal, said logic output signal further transitions from said steady state voltage to become synchronized with said clocking signal at a time in which one input receives a state of said clocking signal which is equivalent to a desired state of the logic output signal synchronized with said clocking signal at a time coincident with a time during which said other input ceases receiving the delayed said disable/enable signal; and
   a frequency shift detector circuit having two detector inputs and a detector output, wherein said detector output varies in voltage magnitude depending upon the frequency difference between a carrier signal placed on one detector input and said clocking signal sent from said oscillator and placed on the other detector input.

10. The frequency tracking system as recited in claim 9, wherein said oscillator includes an oscillator input for receiving a voltage level and an oscillator output for delivering said clocking signal of varying frequency dependent upon change in said voltage level.

11. The frequency tracking system as recited in claim 9, wherein said oscillator is a voltage controlled oscillator, said frequency shift detector includes a phase detector.

* * * * *